(12) United States Patent
Escott et al.

(10) Patent No.: US 8,116,485 B2
(45) Date of Patent: Feb. 14, 2012

(54) ADAPTIVE GAIN CONTROL SYSTEM

(75) Inventors: Alex Escott, Vancouver (CA); Phillip A. Hetherington, Port Moody (CA)

(73) Assignee: QNX Software Systems Co, Kanata, Ontario (CA)

(*) Notice: Subject to any disclaimer, the term of this patent is extended or adjusted under 35 U.S.C. 154(b) by 1191 days.

(21) Appl. No.: 11/130,080

(22) Filed: May 16, 2005

(65) Prior Publication Data

US 2007/0003078 A1   Jan. 4, 2007

(51) Int. Cl.
*H03G 3/00* (2006.01)
*H03G 7/00* (2006.01)
*H03G 3/20* (2006.01)
*H04R 29/00* (2006.01)

(52) U.S. Cl. ........ 381/107; 381/104; 381/105; 381/106; 381/56; 381/57

(58) Field of Classification Search .................. 381/109, 381/104–107, 95–96, 56–57
See application file for complete search history.

(56) References Cited

U.S. PATENT DOCUMENTS

| | | | |
|---|---|---|---|
| 5,949,886 A * | 9/1999 | Nevins et al. | 381/57 |
| 6,597,898 B1 | 7/2003 | Iwata et al. | |
| 6,674,865 B1 | 1/2004 | Venkatesh et al. | |
| 6,782,063 B1 | 8/2004 | Stevenson et al. | |
| 6,795,694 B2 | 9/2004 | Uesugi | |
| 6,816,013 B2 | 11/2004 | Kao | |
| 6,839,427 B2 | 1/2005 | Tahernezhaadi et al. | |
| 6,885,851 B1 | 4/2005 | Miura | |
| 6,903,611 B2 | 6/2005 | Kao | |
| 7,747,028 B2 * | 6/2010 | Saito et al. | 381/107 |

* cited by examiner

*Primary Examiner* — Devona Faulk
*Assistant Examiner* — George Monikang

(57) ABSTRACT

An automatic gain control system maintains desired signal content level, such as voice, in an output signal. The system includes automatic gain control over an input signal, and compensates the output signal based on input signal content. When the input signal level exceeds an upper or lower processing threshold level, or is distorted (e.g., clipped), the system applies a gain to the input signal level. The system may compensate for the gain in the output signal when the input signal includes desired signal content.

27 Claims, 5 Drawing Sheets

ADAPTIVE GAIN CONTROL SYSTEM

BACKGROUND OF THE INVENTION

1. Technical Field

This invention relates to signal gain control. In particular, this invention relates to controlling input signal level without compromising the strength of desired content in an output signal derived from the input signal.

2. Related Art

Signal processing systems ranging from remote sensing systems to wireless communication systems enhance dynamic performance using automatic gain control. Automatic gain control adjusts input signal gain as a function of another parameter, such as received signal level. If a signal level is too high or too low, the automatic gain control may attenuate or amplify the input signal to keep the received signal level within a specified range.

Automatic gain control operates in isolation, however. Downstream processing operates on the gain-controlled signal, but without knowledge of what gains were applied or why they were applied. The downstream processing produces an output signal based on or derived from the input signal. Thus, the strength, quality, or content of the output signal may be detrimentally influenced by the automatic gain control.

In speech processing systems, automatic gain control may suppress desired speech signal content in the input signal. Subsequent processing stages which depend on sufficient levels of speech signal are hampered by the suppression. Voice recognition is particularly sensitive to speech signal level, and may yield inaccurate results ultimately stemming from isolated application of automatic gain control. Wireless voice networks also are sensitive to input signal levels which must lie within established ranges for proper transmission.

There is a need for a system that overcomes the detrimental impact of automatic gain control on an output signal.

SUMMARY

This invention provides an automatic gain control system which takes input signal content into consideration. The system maintains a consistent level for desired signal content, such as voice, in an output signal. The system compensates the output signal based on the input signal content.

The system determines whether an input signal level exceeds a processing bound, such as an upper or lower signal level threshold. The system also may determine whether the input signal is distorted (e.g., clipped). When the input signal level exceeds the bound or is distorted, the system responsively attenuates the input signal level and applies a compensating gain to the output signal.

The system may also determine why the input signal exceeds the bound or is distorted. When the reason is undesired signal content, but desired signal content is also present in the input signal, the system compensates the output signal for the attenuation applied to the input signal. The desired signal content passes through the processing system at a consistent level.

In some cases, desired signal content causes the distortion or causes the input signal to exceed the bound. The attenuation applied to the input signal in such cases causes the desired signal content to lie in an appropriate range for downstream processing. The system may then forgo compensation of the output signal for the attenuation applied to the input signal.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

An automatic gain control system includes gain control logic which maintains a consistent level for desired components in an output signal. The gain control logic may establish and adapt input gain applied to an input signal as well as output gain applied to an output signal. When input gain is applied to correct the level of an unwanted signal, the gain control system may compensate the output signal to maintain desired signal component levels.

Figure 1:
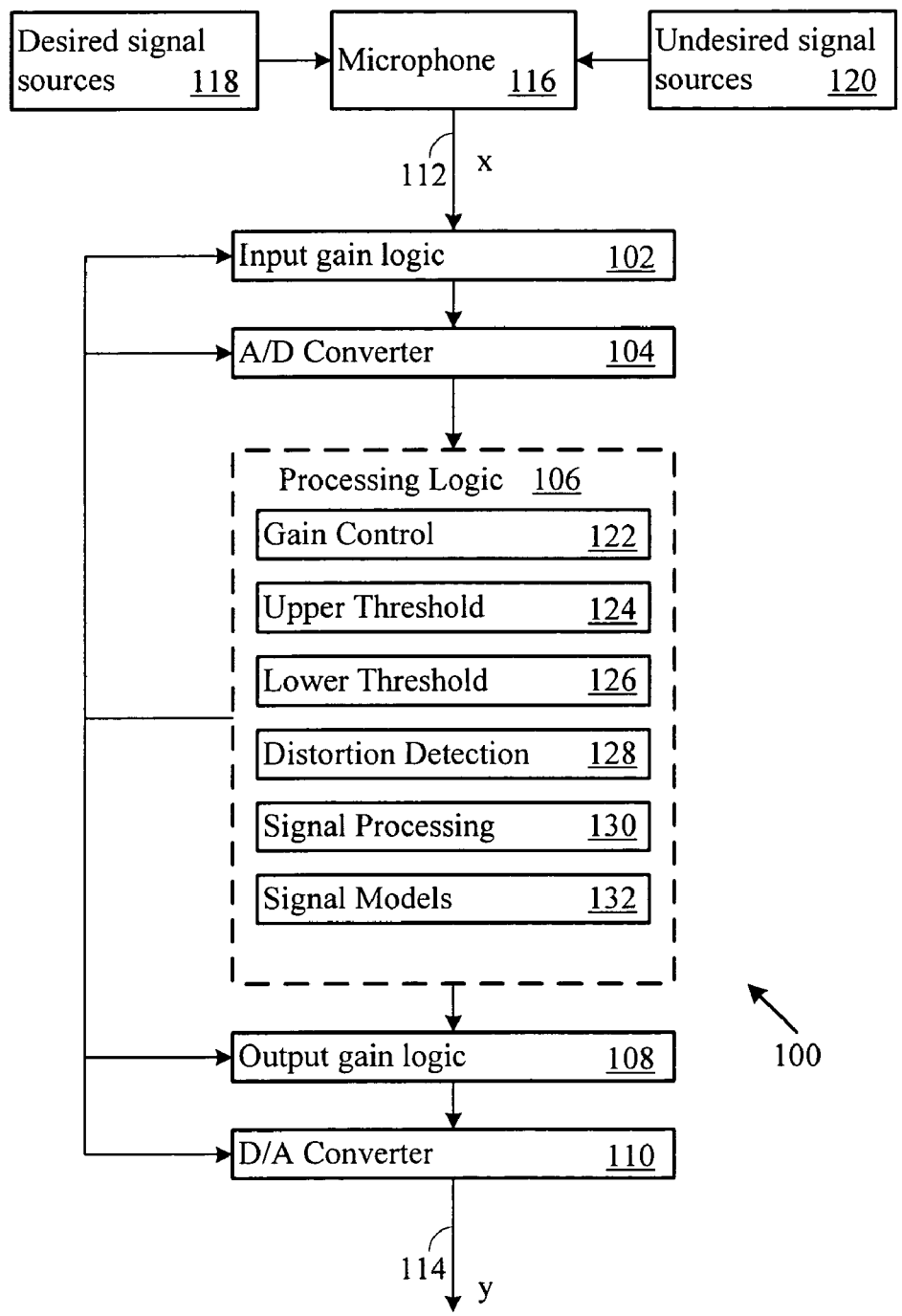
FIG. 1 is an automatic gain control system.

In FIG. 1, a processing system includes an automatic gain control system 100. The processing system includes input gain logic 102 coupled to an analog to digital converter 104. The analog to digital converter 104 provides digitized signal samples to the processing logic 106 in the gain control system 100. The processing logic 106 generates an output signal which may pass through the output gain logic 108 and digital to analog converter 110. The input signal 'x' which the gain control system 100 processes arrives on the input line 112. The processed output signal 'y' may continue to additional processing on the output line 114 and includes desired signal content at a consistent level, while suppressing unwanted signal components.

The input signal 'x' may originate from many different sources. FIG. 1 shows a microphone 116 that senses an acoustic signal and generates an audio input signal. The input signal 'x' may include desired signal components and undesired signal components. The desired signal components originate from desired signal sources 118, while the undesired signal components originate from undesired signal sources 120.

For a handsfree telephone call, the desired signal components may include the voice of the person speaking. The undesired signal components may include the audio output of the call. The audio output may return to the system 100 through the microphone 116 as echo noise. In a voice recognition application, the desired signal components may include the voice of the person speaking. The undesired signal components may include a voice prompt or other audio which the voice recognition application plays to the person speaking.

The desired signal sources 118 vary according to the application in which the system 100 is employed. In a speech processing application, the desired signal sources 118 may include a human speaker. The speaker may interact with the speech processing application to issue voice commands to a vehicular speech recognition system, to record voice, to broadcast or transmit voice, or for other reasons. The desired signal sources 118 contribute desired signal components to the input signal 'x'.

The undesired signal sources 120 may be noise sources. In the context of vehicular speech recognition, the undesired signal sources 120 may include road noise, radio or stereo output, wind noise, or other noise sources. The noise sources contribute undesired signal components to the input signal 'x'.

The input signal 'x' undergoes automatic gain control. The input gain logic 102 adjusts an input gain applied to the input signal 'x'. The input gain may be a positive gain (i.e., an amplification) or a negative gain (i.e., an attenuation) applied to the input signal 'x'. The A/D converter 104 digitizes the gain-controlled input signal and delivers digital samples of the gain-controlled input signal to the processing logic 106.

The processing logic 106 includes gain control logic 122. The gain control logic 122 establishes and adjusts the input gain. In one implementation, the gain control logic 122 determines adjustments to the input gain to keep level of the input signal 'x' under the upper threshold 124 and/or above the lower level threshold 126. The thresholds 126 and/or 126 may be input signal level thresholds or may be thresholds for specific components of the input signal, such as voice.

Alternatively or additionally, the gain control logic 122 establishes and/or adjusts the input gain in response to the distortion detection logic 128. The distortion detection logic 128 may detect input signal clipping or other distortions of the input signal 'x'. The distortion detection logic 128 may detect input signal clipping by examining the gain-controlled input signal or the digital samples produced by the A/D converter 104. Input signal clipping may be present when the gain-controlled input signal is consistently at a maximum level, when the digital samples are consistently maximum in value, or when other conditions are present. When input signal clipping is present, the gain control logic 122 may reduce the input gain.

The distortion detection logic 128 may detect clipping or other distortions that are detrimental to operation of the signal processing logic 130. The signal processing logic 130 may be noise reduction logic such as echo cancellation logic, signal enhancement logic, or logic that implements any other type of processing. When the signal processing logic 130 is echo cancellation logic, the distortion detection logic 128 adjusts the input gain to eliminate clipping distortion in the input signal.

The input gain logic 102 attenuates the input signal 'x' to eliminate or reduce input signal distortion, such as clipping. The clipping may be caused by undesired signal components, such as wind noise from an open window. The distortion also may be caused by desired signal components, such as voice commands to a voice recognition system. When the voice level or noise level increases, the input signal may experience persistent or temporary clipping.

The system 100 detects the desired signal components and undesired signal components in the input signal 'x'. Undesired echo components in the input signal 'x' may be reduced or eliminated using an echo cancellation program. Additionally, the detection and/or removal of the undesired signal components may be based on pattern recognition programs which employ the undesired signal models 132. The undesired signal models 132 may provide a representation of noise characteristics that arise from wind buffeting on a microphone, mechanical artifacts, echoes from a nearby speaker, or other noise representations.

An undesired signal may be identified by beamforming logic. The beamforming logic responds to signals received from multiple microphones distributed in a vehicle. The beamforming logic may correlate the signals to determine signal components originating from a driver, passenger, or other signal source in the vehicle. The source of the signal components may be identified based on a reception angle mapped to locations in the vehicle. The system 100 may then consider the signal originating from a particular signal source (e.g., a passenger) as an undesired signal, such as when the driver is interacting with a voice recognition system in the vehicle. When the gain logic 102 attenuates the input signal 'x', the level of desired signal components present in the input signal 'x' are reduced. For cases in which desired signal components caused the distortion, the processing logic 106 may carry the attenuation of the input signal through without compensation in the output signal 'y'. The desired signal components thereby remain at an appropriate level for downstream processing.

When undesired signal components caused the distortion, the processing logic 106 may compensate for the attenuation of desired signal components in the input signal 'x'. The gain control logic 122 may apply an output gain through the output gain logic 108. The output gain compensates the output signal 'y' for the reduction in level of the desired signal components caused by the input attenuation. The output gain may be a function of the input gain, the desired signal level, the undesired signal level, or any combination thereof, and may wholly or partially compensate for the input gain.

The output gain logic 108 may be implemented in many ways. The output gain logic 108 may apply the output gain to digital signal samples prior to digital to analog conversion. Alternatively or additionally, the output gain logic 108 may include an analog signal amplifier that follows the D/A converter 110. The output signal 'y' is compensated for the attenuation of desired signal components in the input signal 'x'.

Figure 2:
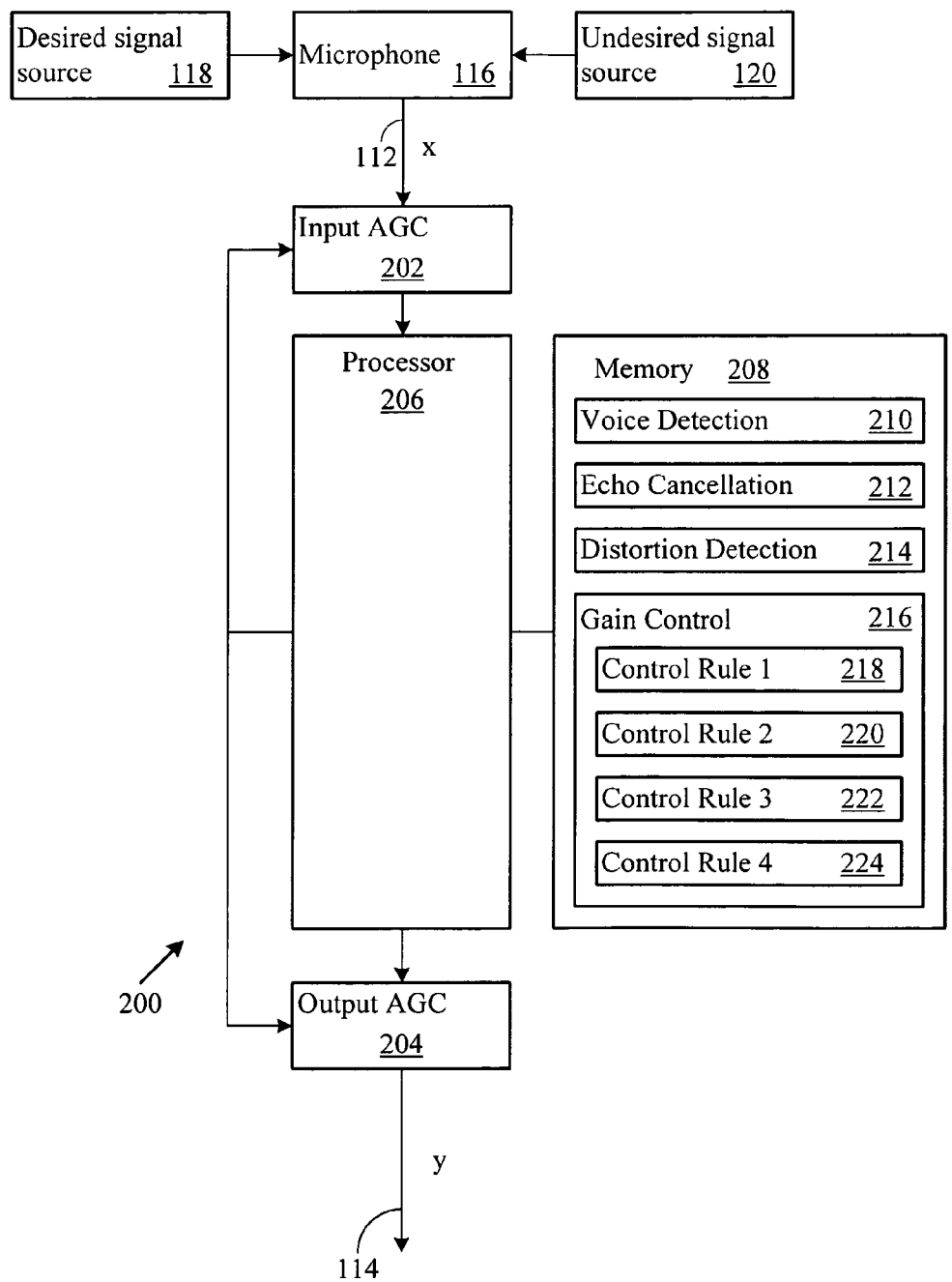
FIG. 2 is an automatic gain control system.

FIG. 2 shows an alternative implementation of a processing system which includes an automatic gain control system 200. The system 200 is explained below in the context of a preprocessing system for voice recognition. The system 200 may be incorporated into any other system.

The processing system includes input automatic gain control (AGC) logic 202 and output automatic gain control (AGC) logic 204. The AGCs 202 and 204 may include variable gain amplifiers. The processor 206 controls the gains applied by the input AGC 202 and output AGC 204. The processor 206 connects to the memory 208, which includes, in addition to the gain control program 216 itself, a voice detection program to 210, an echo cancellation program 212, and a distortion detection program to 214.

Voice commands mixed with undesired signal components are present in the input signal 'x'. The processor 206 executes the echo cancellation program 212 to remove undesired echo components from the input signal 'x'. The processor 206 also executes the voice detection program 210 to detect and/or isolate voice components in the input signal 'x'.

The voice detection program 210 may include a harmonic detector, vowel detector, or other speech detector. The voice detection program 210 may also include an endpointing program. The endpointing program determines a beginning and an end to a desired signal component, such as an utterance in the input signal 'x' which his spoken by an individual interacting with a voice recognition system.

As the system 200 processes the input signal 'x', the distortion detection program 214 determines whether the input signal exceeds a threshold, falls below a threshold, is clipping or is otherwise distorted. When distortion is present, the gain control program 216 adapts the input gain applied by the input AGC 206. The gain control program 216 also adapts the output gain applied by the output AGC 204 to compensate for the input gain. The input gain may be an attenuation or an amplification. The output gain may be a compensating amplification or attenuation.

The gain control program 216 may establish or adjust the input gain and/or the output gain according to gain control rules. The gain control rules may be implemented as logical tests, statements, or conditions in the gain control program 216, as a neural network, fuzzy logic system, or in other ways. FIG. 2 shows four gain control rules 218, 220, 222, and 224 in the memory 208. Table 1 shows one implementation of the gain control rules 218-222.

TABLE 1

| Rule Number | Gain Control Rule |
|---|---|
| 1 | If an undesired signal component is causing input signal clipping, then increase input signal attenuation. |
| 2 | If a desired signal component is causing input signal clipping, then increase input signal attenuation. |
| 3 | If a desired signal component is present in the input signal, and an undesired signal component is causing input signal clipping, then compensate the output signal based on the input signal attenuation. |
| 4 | If a desired signal component is causing input signal clipping, then forgo compensation of the output signal. |

The first gain control rule 218 establishes that when an undesired signal component is causing input signal clipping, the processor 206 will decrease the input gain. The second gain control rule 220 establishes that when a desired signal component is causing input signal clipping, then the processor 206 also will decrease the input gain. In either case, the input signal is attenuated to reduce or eliminate the clipping. At the same time, desired signal components in the input signal may be attenuated.

The third gain control rule 222 establishes one scenario in which the processor 206 compensates for input signal attenuation. The third gain control rule 222 is applicable when a desired signal component is present in the input signal, and when the undesired signal component is causing the clipping. In that case, the processor 206 compensates the output signal by applying output gain using the output AGC 204.

The fourth gain control rule 224 establishes a scenario in which the processor 206 does not compensate the output signal. According to the gain control rule 224, when the a desired signal component causes input signal clipping, the processor 206 forgoes compensation of the output signal. The input signal attenuation brings the desired signal components to within appropriate levels. Forgoing compensation allows the desired signal components to carry forward in the output signal 'y'.

Figure 3:
FIG. 3 is an input signal.

FIG. 3 shows an input signal 302. The input signal 302 crosses the upper threshold 124 at point 304, and crosses the lower threshold 126 at point 306. The upper threshold 124 and lower threshold 126 may be signal level thresholds that establish a desired dynamic range for the input signal 302.

The desired dynamic range may depend on the limitations or capabilities of the input gain logic 102, analog-to-digital converter 104, or the AGC 202. Additionally or alternatively, the desired dynamic range may depend on the processing applied to the input signal, including voice detection processing, echo cancellation, or any other processing. The system 200 may change the desired dynamic range at any time.

Figure 4:
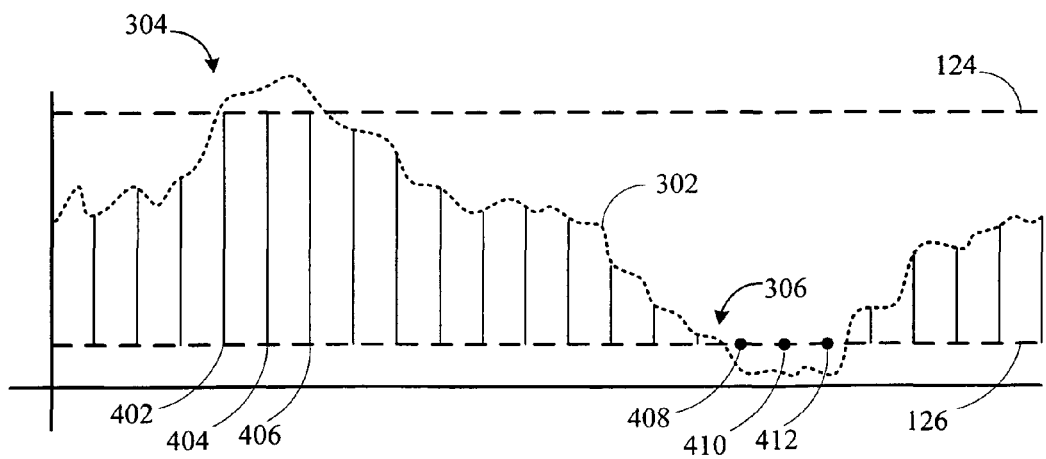
FIG. 4 is a sampled input signal.

FIG. 4 shows the input signal 302 sampled by the analog-to-digital converter 104. As the input signal 302 crosses the upper threshold 124, the digital samples 402, 404, 406 produced by the analog-to-digital converter 104 consistently take on a maximum value consistent with input signal clipping. As the input signal 302 crosses the lower threshold 126, the digital samples 408, 410, 412 consistently take on a minimum value consistent with the input signal clipping.

An input attenuation applied to the input signal at point 304 reduces the input signal level to lie within the upper threshold 124 and lower threshold 126. An input amplification applied to the input signal at point 304 may increase the input signal level to lie within that the upper threshold 124 and lower threshold 126. In either case the systems 100, 200 may compensate for the input gain by applying an output gain.

Figure 5:
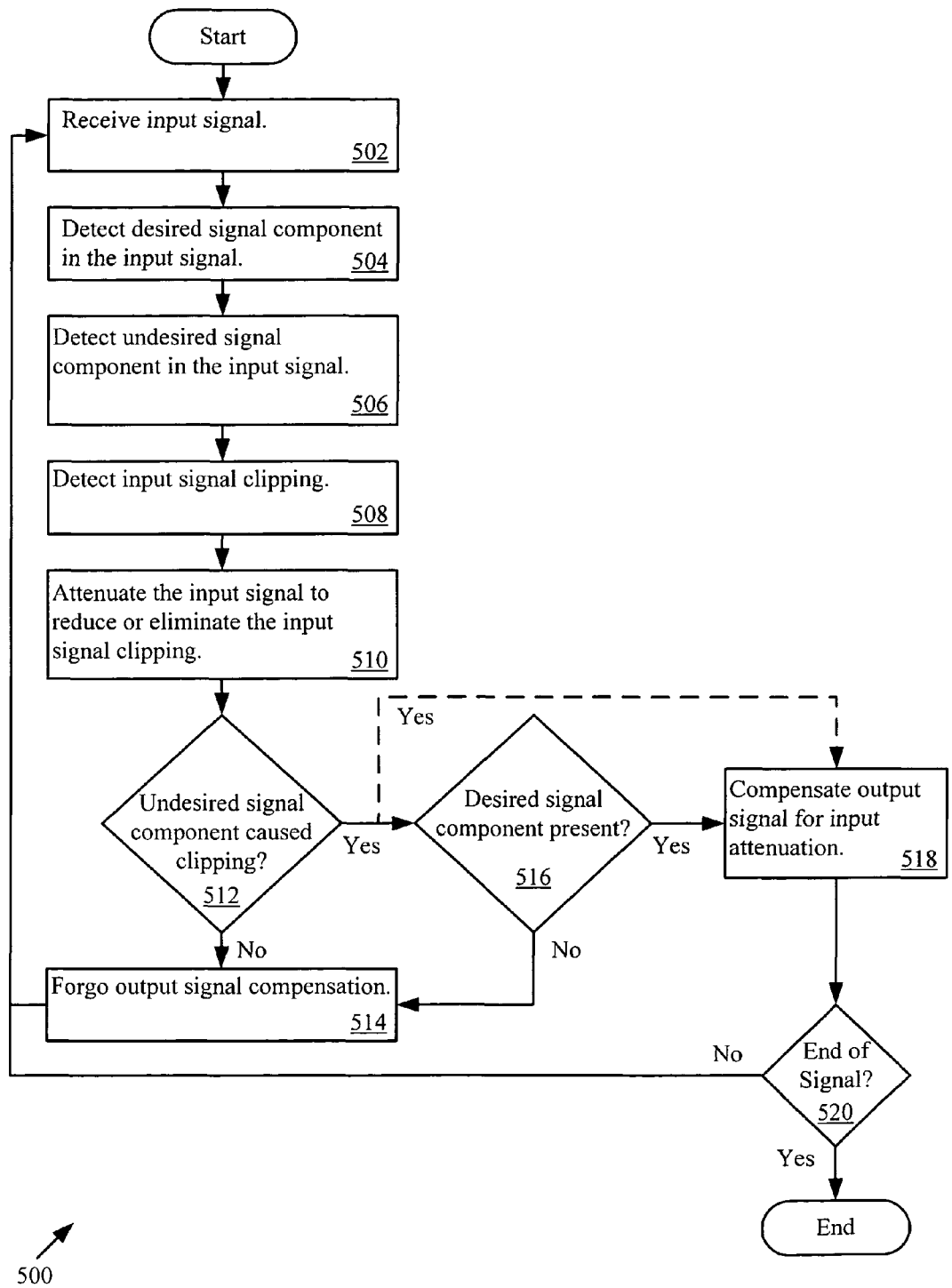
FIG. 5 are acts that an automatic gain control system may take to provide consistent desired signal component level in an output signal.

FIG. 5 shows the acts that the systems 100, 200 and may take to provide automatic gain control. The systems 100, 200 receive an input signal (Act 502) and detect desired signal components, such as voice, in the input signal (Act 504). The system 100, 200 also detect undesired signal components, such as echo, in the input signal (Act 506).

The systems 100, 200 also detect clipping or other distortions in the input signal. When clipping is present, the systems 100, 200 apply an input gain to the input signal. The input gain attenuates the input signal to reduce or eliminate input signal clipping (Act 510).

The systems 100, 200 also determine whether to compensate the output signal for the input signal attenuation. When a desired signal component, such as a loud voice, is causing the clipping (Act 512), the systems 100, 200 may forgo compensation of the output signal (Act 514). The attenuated input signal thus carries the appropriate level of desired signal component through to the output signal.

When an undesired signal component, such as echo, is causing the clipping (Act 512), the systems 100, 200 also may determine whether the output signal should be compensated. In one implementation, when the input signal includes a desired signal component (e.g., voice) (Act 516), the systems 100, 200 compensate the output signal for the input signal attenuation (Act 518). Alternatively, the systems 100, 200 may forgo a determination of whether desired signal content is present and compensate the output signal in each instance (Act 518). The level of the desired signal components in the output signal are adjusted to meet levels appropriate for any additional processing that may follow. The systems 100, 200 continue to automatically control the input and output signal gain until the end of the input signal is reached (Act 520).

Figure 6:
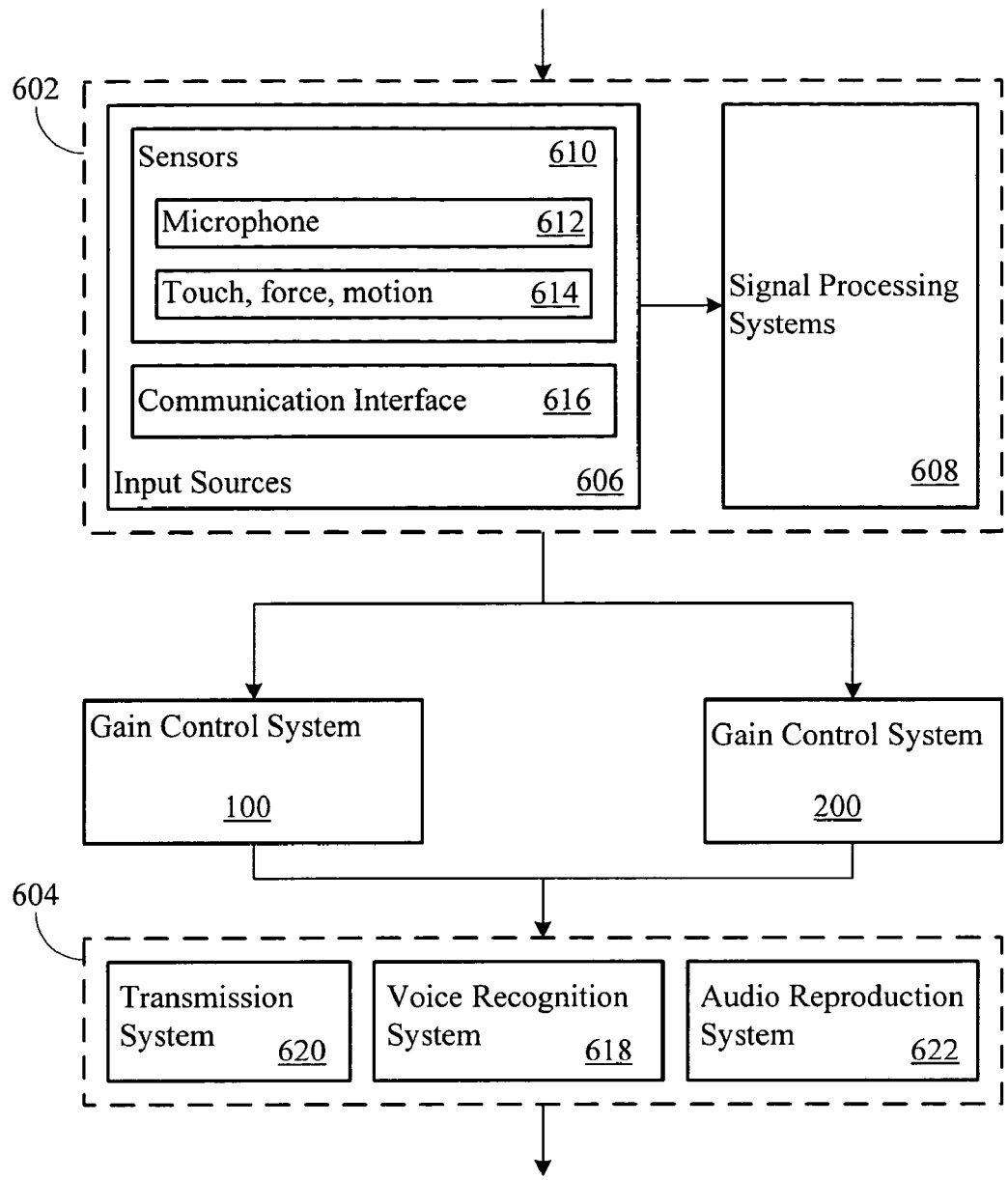
FIG. 6 is a signal processing system employing an automatic gain control system.

In FIG. 6, the automatic gain control systems 100 and/or 200 operate in conjunction with preprocessing logic 602 and post-processing logic 604. The gain control systems may accept input from the input sources 606 directly, or after initial processing by the signal processing systems 608. The signal processing systems 608 may accept digital or analog input from the signal sources 606, apply any desired processing to the signals, and produce an output signal to the gain control systems 100 and/or 200.

The input sources 606 may include digital signal sources or analog signal sources such as analog sensors 610. The input sources may include a microphone 612 or other acoustic sensor. The microphone 612 may accept voice input for a voice recognition system. Other applications may employ other types of sensors 614. The sensors 614 may include touch, force, or motion sensors, inductive displacement sensors, laser displacement sensors, proximity detectors, photoelectric and fiber optic sensors, or other types of sensors.

The digital signal sources may include a communication interface 616, memory, or other circuitry or logic in the system in which the gain control systems 100 and/or 200 are implemented, or other signal sources. When the input source 606 is a digital signal source, the signal processing systems 608 may process the digital signal samples and generate an analog output signal. The gain control systems 100 and/or 200 may process the analog output signal.

The gain control systems 100 and/or 200 also connect to post-processing logic 104. The post-processing logic 104 may include an audio reproduction system 618, digital and/or analog data transmission systems 620, or a voice recognition system 622. The gain control systems 100 and/or 200 may provide a gain compensated output signal to any other type of post-processing logic.

The voice recognition system 618 may include circuitry and/or logic that interprets, takes direction from, records, or otherwise processes voice. The voice recognition system 618 may be process voice as part of a handsfree car phone, desktop or portable computer system, entertainment device, or any other system. In a handsfree car phone, the gain control systems 100 and/or 200 may remove echo noise and provide a consistent level of desired signal components in the output signal delivered to the voice recognition system 618.

The transmission system 620 may provide a network connection, digital or analog transmitter, or other transmission circuitry and/or logic. The transmission system 620 may communicate enhanced signals generated by the gain control systems 100/200 to other devices. In a car phone, for example, the transmission system 620 may communicate enhanced signals from the car phone to a base station or other receiver through a wireless connection such as a ZigBee, Mobile-Fi, Ultrawideband, Wi-fi, or a WiMax network.

The audio reproduction system 622 may include digital to analog converters, filters, amplifiers, and other circuitry or logic. The audio reproduction system 622 may be a speech and/or music reproduction system. The audio reproduction system 622 may be implemented in a cellular phone, car phone, digital media player/recorder, radio, stereo, portable gaming device, or other devices employing sound reproduction.

The gain control systems 100 and/or 200 may be implemented in hardware and/or software. The gain control systems 100 and/or 200 may include a digital signal processor (DSP), microcontroller, or other processor. The processor may execute instructions that detect input signal components, attenuate the input signal to reduce distortion, and compensate an output signal for the input signal attenuation. Alternatively, the gain control systems 100 and/or 200 may include discrete logic or circuitry, a mix of discrete logic and a processor, or may be distributed over multiple processors or programs.

The gain control systems 100 and/or 200 may take the form of instructions stored on a machine readable medium such as a disk, EPROM, flash card, or other memory. The gain control systems 100 and/or 200 may be incorporated into communication devices, sound systems, gaming devices, signal processing software, or other devices and programs. The gain control systems 100 and/or 200 may pre-process microphone input signals to provide a consistent level of desired signal content for other processing logic, including speech recognition systems.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. An automatic gain control method executed by a gain control system, comprising
    determining whether an input signal level of an input signal comprising desired signal content and undesired signal content exceeds a processing bound on signal levels for subsequent signal processing;
    attenuating the input signal when the input signal level of the input signal exceeds the processing bound to provide an output signal;
    determining a desired signal content level of the desired signal content in the input signal and an undesired signal content level of the undesired signal content in the input signal;
    determining whether the desired signal content level of the desired signal content in the input signal caused the input signal level to exceed the processing bound;
    compensating the output signal for the of the desired signal content in the input signal when the desired signal content level of the desired signal content in the input signal did not cause the input signal level to exceed the processing bound, where the compensating of the output signal is controlled such that an output signal level of the output signal does not exceed the processing bound; and
    forgoing compensation of the output signal for the attenuation of the input signal when the desired signal content level caused the input signal level to exceed the processing bound.

2. The automatic gain control method of claim 1, further comprising:
    determining whether the input signal level of the input signal falls below a lower threshold for subsequent signal processing; and
    amplifying the input signal when the input signal level falls below the lower threshold such that a signal level of the output signal falls below a upper threshold and above the lower threshold.

3. The automatic gain control method of claim 1, further comprising:
    determining whether the input signal level exceeds an upper threshold of the processing bound or falls below a lower threshold for noise reduction processing of the input signal.

4. The automatic gain control method of claim 1, where determining whether the input signal level of the input signal exceeds the processing bound comprises:
    determining whether the input signal is clipped.

5. The automatic gain control method of claim 1, where the desired signal content is voice.

6. The automatic gain control method of claim 1, where determining whether the input signal level of the input signal exceeds the processing bound comprises:
    determining whether the input signal level results in input signal clipping.

7. An automatic gain control system comprising:
    input gain logic for producing an output signal by applying an input gain to an input signal comprising a desired component and an undesired component;
    output gain logic for applying an output gain to the output signal;
    detection logic coupled to the input gain logic for detecting a distortion of the input signal and determining whether the distortion was induced by the undesired component or induced by the desired component in the input signal; and amplification control logic coupled to the input and output gain logic, wherein the detection logic and the amplification control logic are operable to apply the input gain to the input signal in response to the distortion, and compensate for the input gain applied to the desired component in the input signal by applying the output gain to the output signal, when the detection logic determines that the distortion was induced by the undesired component of the input signal, and forgoing the applying the output gain to the output signal when the detection logic determines that the distortion was induced by the desired component in the input signal.

8. The automatic gain control system of claim 7, where the input gain is an input attenuation and where the output gain is an output amplification.

9. The automatic gain control system of claim 7, where the input gain is an input amplification and where the output gain is an output attenuation.

10. The automatic gain control system of claim 7, where the distortion induced by the undesired component of the input signal is input signal clipping.

11. The automatic gain control system of claim 10, where the input gain is an input attenuation that reduces the input signal clipping, and where the output gain is an output amplification.

12. The automatic gain control system of claim 7, further comprising noise processing logic operable to reduce the noise in the input signal.

13. The automatic gain control system of claim 7, further comprising echo cancellation logic operable to reduce echo noise in the input signal.

14. An automatic gain control method executed by a gain control system, comprising: detecting clipping of an input signal comprising a desired signal component and a noise signal component; reducing input signal gain by the gain control system in response to the clipping; determining whether the clipping was induced by the noise signal component or by the desired signal component; and when the clipping was induced by the noise signal, compensating for the reduced input signal gain applied to the desired signal component in an output signal obtained from the input signal, otherwise forgoing compensating for the reduced input signal gain.

15. The automatic gain control method of claim 14, where compensating the output signal comprises applying an output amplification to the output signal.

16. The automatic gain control method of claim 14, where the desired signal component comprises voice.

17. The automatic gain control method of claim 14, where compensating the output signal comprises applying an output attenuation to the output signal.

18. The automatic gain control method of claim 14, where detecting the clipping comprises monitoring analog to digital converter samples of the input signal.

19. A non-transitory machine readable medium; and instructions stored on the medium that cause a processing system to: determine whether an input signal level of an input signal, comprising a desired signal content and an undesired signal content, exceeds a processing bound on signal levels for subsequent signal processing; attenuate the input signal when the input signal level of the input signal exceeds the processing bound to provide an output signal; determine whether the desired signal content caused the level of the input signal to exceed the processing bound; compensate for the attenuation of the desired signal content in the input signal by amplifying the output signal; and forgo compensation in the output signal for the attenuation of the input signal when the desired signal content caused the input signal to exceed the processing bound.

20. The non-transitory machine readable medium of claim 19, where the instructions that compensate: compensate the output signal for the attenuation of the desired signal content in the input signal, where the compensating is suspended when the desired signal content caused the level of the input signal to exceed the processing bound and where the compensating is resumed when the desired signal content does not cause the level of the input signal to exceed the processing bound.

21. The non-transitory machine readable medium of claim 19, where the instructions that determine whether the level of the input signal exceeds the processing bound signal comprises: determine whether the level of the input signal exceeds an upper threshold or falls below a lower threshold for subsequent signal processing and responsively attenuate the input signal where the attenuating is controlled such that a level of the attenuated input signal falls below the upper threshold and above the lower threshold.

22. The non-transitory machine readable medium of claim 19, where the instructions that determine whether the input signal level exceeds the processing bound: determine whether the level of the input signal exceeds an upper threshold or falls below a lower threshold for signal processing of the input signal.

23. The non-transitory machine readable medium of claim 22, where the signal processing comprises echo cancellation processing.

24. The non-transitory machine readable medium of claim 22, where the signal processing comprises noise reduction processing.

25. The non-transitory machine readable medium of claim 22, where the signal processing comprises beam forming processing.

26. The non-transitory machine readable medium of claim 19, where the desired signal content comprises voice.

27. An automatic gain control method executed by a gain control system, comprising: (a) determining whether an input signal level of an input signal comprising desired signal content and undesired signal content exceeds a processing bound and; (b) attenuating the input signal by the gain control system to produce an output signal when the input signal level exceeds the processing bound; (c) determining, responsive to the determining of (a), a desired signal content level of the desired signal content in the input signal and an undesired signal content level of the undesired signal content in the input signal; (d) determining whether the desired signal content level of the desired signal content in the input signal caused the input signal level to exceed the processing bound in (a); (e) compensating the output signal for the attenuation of the desired signal content in the input signal when the desired signal content level of the desired signal content in the input signal did not cause the input signal level to exceed the processing bound in (a), where the compensating of the output signal is controlled such that an output signal level of the output signal does not exceed the processing bound; and (f) forgoing compensation in the output signal for the attenuation of the input signal when the desired signal content level caused the input signal level to exceed the processing bound in (a).

* * * * *

UNITED STATES PATENT AND TRADEMARK OFFICE
CERTIFICATE OF CORRECTION

| | | |
|---|---|---|
| PATENT NO. | : 8,116,485 B2 | Page 1 of 1 |
| APPLICATION NO. | : 11/130080 | |
| DATED | : February 14, 2012 | |
| INVENTOR(S) | : Alex Escott and Philip A Hetherington | |

It is certified that error appears in the above-identified patent and that said Letters Patent is hereby corrected as shown below:

Please amend the following:

Column 8, line 23 claim 1 should read "compensating the output signal for the attenuation of the desired signal"

Column 8, line 41 claim 2 should read "output signal falls below an upper threshold and above the"

Column 9, line 13 claim 7 should read "input signal, and forgoing applying the output gain to"

Signed and Sealed this

Seventeenth Day of July, 2012

David J. Kappos
*Director of the United States Patent and Trademark Office*